United States Patent [19]

Eklund

[11] Patent Number: 5,150,184
[45] Date of Patent: Sep. 22, 1992

[54] METHOD FOR FORMING EMITTERS IN A BICMOS PROCESS

[75] Inventor: Robert H. Eklund, Plano, Tex.

[73] Assignee: Texas Instruments Incorporated, Dallas, Tex.

[21] Appl. No.: 706,433

[22] Filed: May 24, 1991

Related U.S. Application Data

[63] Continuation of Ser. No. 306,439, Feb. 3, 1989, Pat. No. 5,047,357.

[51] Int. Cl.$^5$ .............................................. H01L 29/72
[52] U.S. Cl. ....................................... 357/34; 357/42; 357/43; 357/59; 357/63
[58] Field of Search ................. 357/34, 42, 43, 59, 357/63

[56] References Cited

U.S. PATENT DOCUMENTS

| | | | |
|---|---|---|---|
| 4,647,958 | 3/1987 | Gardner | 357/59 |
| 4,782,030 | 11/1988 | Katsumata et al. | 357/59 |
| 4,969,026 | 11/1990 | Van Der Velden et al. | 357/34 |

Primary Examiner—Edward J. Wojoiechowicz
Attorney, Agent, or Firm—Ira S. Matsil; B. Peter Barndt; Richard L. Donaldson

[57] ABSTRACT

A bipolar transistor and method of making the same is disclosed. The transistor has an emitter region which is diffused from polysilicon into the intrinsic base region, where the polysilicon is doped with two dopant species of different diffusivity. The impurity concentration of the higher diffusivity species, for example phosphorous, can be selected to define the emitter junction depth, which is preferably shallow, while the impurity concentration of the lower diffusivity species, for example arsenic, can be selected to provide a high conductivity emitter electrode, as well as reduce the sensitivity of the emitter electrode to counterdoping from the implantation of the extrinsic base region. The structure is compatible with BiCMOS processing, as the same anneal can be used to diffuse the emitter and the source/drains of the MOS transistors, with the emitter junction depth optimized via the implant conditions of the higher diffusivity species. The emitter electrode according to the invention can also be exposed to the opposite conductivity type source/drain implant, with reduced sensitivity to counterdoping.

22 Claims, 4 Drawing Sheets

METHOD FOR FORMING EMITTERS IN A BICMOS PROCESS

This is a continuation of application Ser. No. 306,439, filed Feb. 3, 1989, now U.S. Pat. No. 5,047,357, issued Sep. 10, 1991.

This application is in the field of integrated circuits, and is more specifically directed to methods of forming bipolar transistors.

BACKGROUND OF THE INVENTION

The development of modern integrated circuits continues to follow a trend toward a higher density of active components within a single integrated circuit chip, with the performance of the active components also improving with the higher density. To achieve such higher densities and improved performance, the size of transistor features such as gate length in MOS circuits and emitter contact size in bipolar circuits must, of course, be reduced. In addition, however, improved performance of the components also requires reduction of the vertical dimension of certain transistor features. For example, high performance bipolar and BiCMOS (merged bipolar and CMOS) circuits require scaling of the depth of the emitter junction into the base region of the bipolar transistors. First, a shallower emitter junction will provide a steeper doping gradient at the emitter-base junction. Secondly, a shallower emitter junction allows a shallower base region to be used. Since a shallower implant can be more tightly controlled, the reduced depth of the emitter junction allows tight control of a narrow base width.

It is tell known, in modern n-p-n bipolar transistors, to form the diffused emitter region by the diffusion of n-type dopant from a doped polysilicon layer which is in contact with the base region via a contact opening through an oxide layer overlying the intrinsic (lightly doped) base region. The depth of the emitter junction of course depends upon the time and temperature of the drive-in anneal, and also upon the impurity species and concentration in the emitter polysilicon. A shallower emitter junction thus can be formed by way of reducing the impurity concentration in the emitter polysilicon. FIG. 1 is a plot, based on SUPREM3 simulation, of the junction depth of the emitter junction for various concentrations of phosphorous dopant in the emitter polysilicon. For identical anneal conditions (e.g., 900 degrees Celsius for 25 minutes), the effect of doping concentration on the junction depth is apparent from FIG. 1.

However, disadvantages arise from such reduction of the impurity concentration in the emitter polysilicon. Since the conductivity of the emitter polysilicon decreases with the impurity concentration, reduced impurity concentration in the emitter polysilicon will result in increased series resistance for the emitter electrode. With the small cross-sectional areas for the emitter polysilicon in high density circuits, further reduction i the conductivity will clearly impact the circuit performance. Furthermore, if the bipolar transistor is in a BICMOS structure, reduction in the n-type impurity concentration of the emitter electrode (and gate electrodes for p-channel MOS transistors formed form the same polysilicon layer as the emitter polysilicon) can allow significant counterdoping of the emitter polysilicon if exposed to the p-type source/drain implant. Such counterdoping will, of course, further reduce the conductivity of the emitter (and gate) electrodes, and reduce it in such a way that the conductivity will be highly sensitive to the p-type source/drain implant. Even in a purely bipolar structure, such counterdoping of the emitter polysilicon may occur if the extrinsic base implant is performed after the formation of the emitter polysilicon and if the emitter polysilicon is exposed to the extrinsic base, implant.

Another approach to the reduction of emitter junction, depth is the use of arsenic as the n-type dopant in the emitter polysilicon, rather than phosphorous. Since arsenic diffuses relatively slowly in silicon as compared with phosphorous, the temperature of the drive-in anneal must be increased As is well known in the art, it is desirable to minimize processing temperatures in order to maintain shallow junction depths, and to minimize lateral diffusion, in other regions of the device. Furthermore, the reduced diffusivity of arsenic makes this dopant more sensitive to interfacial layers which may impede the diffusion, limiting the reproducibility of consistent emitter junction depths.

Yet another approach to reducing the emitter junction depth is the use of rapid thermal processing (sometimes referred to as "rapid thermal annealing" or "RTA") as the emitter drive-in anneal. FIG. 2 is a plot, based on SUPREM3 simulation, of the junction depth versus the polysilicon impurity concentration, after RTA of 30 seconds at 1050 degrees Celsius. While, the emitter junction depths are reduced by such an anneal, in a BiCMOS process where the source and drain regions are diffused with the same anneal as the emitter junction, the shallower junction due to the RTA for the emitter will also result for the source and drain regions of the MOS devices. Such shallower junctions may not be desired for the MOS devices on the same chip.

It is therefore an object of this invention to provide a method for fabricating a bipolar transistor where the emitter polysilicon is doped with two types of dopant so that a shallow emitter junction may be formed without reduction of the conductivity of the polysilicon emitter electrode.

It is further object of this invention to provide such a method where the emitter electrode is relatively insensitive to subsequent implantation of dopant of the opposite conductivity type.

It is a further object of this invention to provide such a process which minimizes the processing temperatures of the emitter diffusion.

It is a further object of this invention to provide such a method which is compatible with CMOS processing, for incorporation into a BiCMOS integrated circuit It is a further object of this invention to provide such a method where the diffusion of dopant from the emitter polysilicon can be done with the same anneal step as used to form the source/drain regions in MOS transistors on the same chip.

Other objects and advantages of the invention will be apparent to those of ordinary skill in the art having reference to the following specification in conjunction with the drawings.

SUMMARY OF THE INVENTION

The invention may be incorporated into a process for fabricating a bipolar transistor where the emitter polysilicon receives both fast and slow diffusing dopant, for example phosphorous and arsenic, respectively. The rapidly diffusing dopant is for forming the emitter junction and the slower diffusing dopant provides high conductivity for the polysilicon layer due to its reduced diffusivity. This allows the conductivity of the polysilicon to be selected independently from the emitter junction depth. Subsequent to the ion implantation, the polysilicon layer is patterned to define the emitter electrodes is done, and the extrinsic base region is implanted. The mask used for implantation of the extrinsic base region, due to the arsenic which will remain in the emitter polysilicon, need not fully cover the emitter polysilicon, allowing an edge of the extrinsic base to be self-aligned with the emitter polysilicon with the emitter junction remaining relatively shallow. If incorporated into a BiCMOS process, the MOS gate electrodes can be formed in the same polysilicon layer as the emitter, and the emitter polysilicon can be exposed to the p-channel source/drain implant. Furthermore, in the BiCMOS process, the same anneal used for source/drain implant can drive the emitter junction, so that the source/drain implant and emitter junction having independently controllable depths.

DETAILED DESCRIPTION OF THE PREFERRED EMBODIMENT

Referring now to FIGS. 3 through 10, a process for forming a bipolar transistor according to the invention will be described. This embodiment of the invention will be described relative to a BiCMOS process, where not only the bipolar transistor but also n-channel and p-channel transistors are formed in the same integrated circuit chip. The BiCMOS process is illustrative of additional benefits of the invention relative to those obtained from the invention if practiced solely in a bipolar process; however, it should be noted that significant advantages of the invention may be obtained in a bipolar process, without necessarily forming MOS transistors in the same chip.

Figure 3:
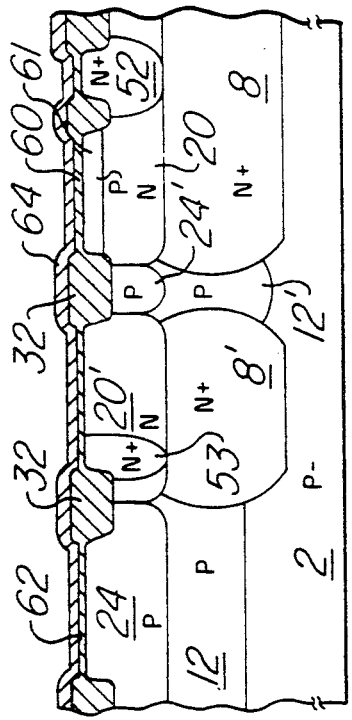

At the point in the manufacture illustrated in FIG. 3, the wells into which the MOS transistors of both types, and the collector and base regions of the bipolar transistor, have already been constructed. Copending application Ser. No. 129,271, filed Dec. 7, 1987 and assigned to Texas Instruments Incorporated, describes a method for forming the structure of FIG. 3. Said application Ser. No. 129,271 is incorporated herein by this reference. Of course, other conventional methods useful for the formation of the collector and base regions of a bipolar transistor, as well as for forming regions into which the MOS transistors of either type can be formed, are equally applicable hereto and can also take advantage of the benefits of the invention.

FIG. 3 illustrates a p- substrate 2, upon which buried n+ regions 8 and buried p regions 12 are formed by way of implantation and anneal, as described in the above-referenced application Ser. No. 129,271. The region at which the bipolar transistor will be formed in FIG. 3, overlies buried n+ region 8 which will serve as a subcollector in the manner well known in the art. N type region 20 overlying buried region 8 will serve as the collector of the bipolar transistor, and n+ region 52 extending from the surface to buried n+ region 8 will serve as a surface contact to the subcollector of buried n+ region 8. Intrinsic base region 61 is formed at the surface of n region 20, into which the emitter and extrinsic base regions will be formed. An oxide layer 60 overlies intrinsic base region 61, through which the emitter contact will be formed to intrinsic base region 61. It should be noted that intrinsic base region 61, according to the method described in said application Ser. No. 129,271, was formed by a boron implant of a dose on the order to 8E13 ions/cm$^2$ at an energy of 80 keV, through an oxide layer 60 on the order of 60 to 150 nm thick. While these conditions for the formation of intrinsic base region 61 may be used in the method according to the invention, it should be noted that the reduced emitter junction depth resulting from the invention will allow a shallower intrinsic base region to be used than that which will result from the above-described conditions. An example of a base implant according to the invention is a boron implant dose of 6E13 ions/cm$^2$ at an energy of 40 keV. The shallower depth for intrinsic base region 61 will of course, translate to a higher performance transistor.

Buried n+ region 8' is also provided in the structure of FIG. 3, and underlies n-well 20' into which the p-channel MOS transistor will be formed. Buried n+ region 8' is not necessary for the operation of the p-channel device, but since it may be formed along with the buried n+ region 8, benefits such as reduced latch-up tendency and more uniform back-gate bias may be obtained by providing buried n+ region 8' under n-well 20'. Overlying n-well 20' is gate oxide 62, which will serve as the gate dielectric of the p-channel transistor to be formed thereat. As described in said application Ser. No. 129,271, it is preferable to provide oxide layer 60 over intrinsic base region 61 which is thicker than gate oxide 62. While this differential is preferred, the benefits of this invention may be obtained for structures where oxide layer 60 is approximately the same thickness as the MOS gate oxide. N+ region 53 is shown in FIG. 3 reaching through n-well 20' from the surface to buried n+ region 8'; this n+ region 53 is optional, but is advantageous in providing a low resistance surface contact to buried n+ region 8' so that uniform well bias can be achieved.

Buried p region 12 is also provided in the BiCMOS structure of FIG. 3, and underlies p-well 24 into which n-channel MOS transistors will be formed; buried p region 12 is relatively more highly doped than p-well 24. Similarly as buried n+ region 8' under n-well 20', buried p region 12 is not necessary for providing the n-channel MOS transistor, but buried p region 12 is useful for junction isolation between neighboring buried n+ regions 8 and 8', as well as for reducing latch-up tendency and in providing uniform back-gate bias to the n-channel transistors in p-well 24. Gate oxide 62 overlies p-well 24 in the same manner as over n-well 20'.

Isolation is provided by field oxide structures 32, which are formed by way of well known local oxidation (LOCOS) techniques, including the polysilicon buffered LOCOS described in U.S. Pat. No. 4,541,167, assigned to Texas Instruments Incorporated. Other isolation structures, including trench isolation, may be alternatively provided As shown in FIG. 3, field oxide structures 32 isolate p-well 24 from n-well 20' at the surface; reverse-biased diode isolation further isolates the adjacent p type and n type regions from one another under field oxide structure 32. Field oxide structures 32 are further provided to isolate, at the surface, n well 20' from collector region 20, and isolate intrinsic base 61 from n+ collector contact 52. As shown, it may be preferable to provide buried p region 12' and an overlying p-well 24' to provide further isolation between adjacent regions of common conductivity type such as n-well 20' and n collector region 20.

Polycrystalline silicon (polysilicon) layer 64 is deposited over the surface of the structure as a first polysilicon layer in the formation of the emitter and gate electrodes. A threshold adjust implant may be done at this time, as is well known, to adjust the threshold of the MOS transistors to fit the desired circuit operation.

The preferred embodiment of the invention describe herein utilizes a split polysilicon process for forming the emitter and gate electrodes, to achieve the benefits of improved gate oxide integrity which such a method provides. It should be noted, however, that the benefits of the invention directed to the formation of shallow emitter junctions in conjunction with high conductivity emitter electrodes may be obtained in a process which uses a single polysilicon layer to form the emitter electrode The benefits of the invention may also be used in conjunction with other bipolar structures where the emitter junction is diffused from the emitter electrode, such as in the double polysilicon bipolar transistor described in U.S. Pat. No. 4,753,709 issued Jun. 28, 1988, and assigned to Texas Instruments Incorporated.

Figure 1:
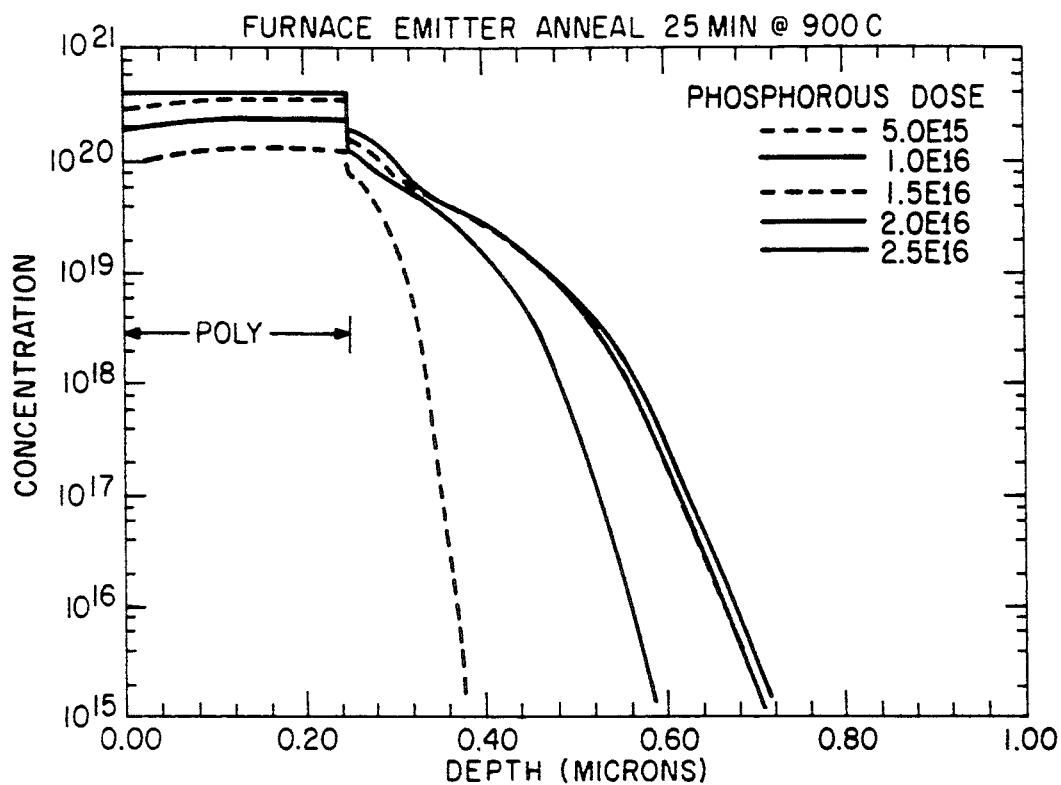
FIG. 1 is a plot of emitter junction depth versus emitter polysilicon implant dose, for a transistor formed according to the prior art.
Figure 2:
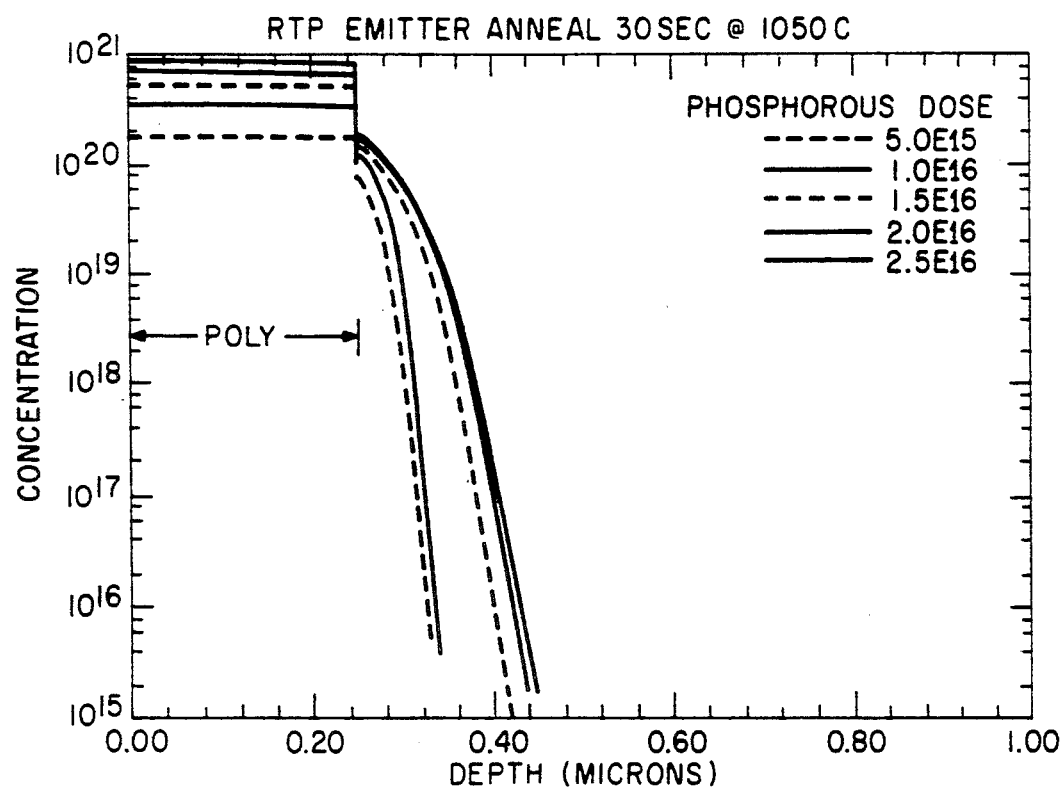
FIG. 2 is a plot of emitter junction depth versus emitter polysilicon implant dose, for a transistor formed according to the prior art utilizing rapid thermal anneal.
Figure 4:
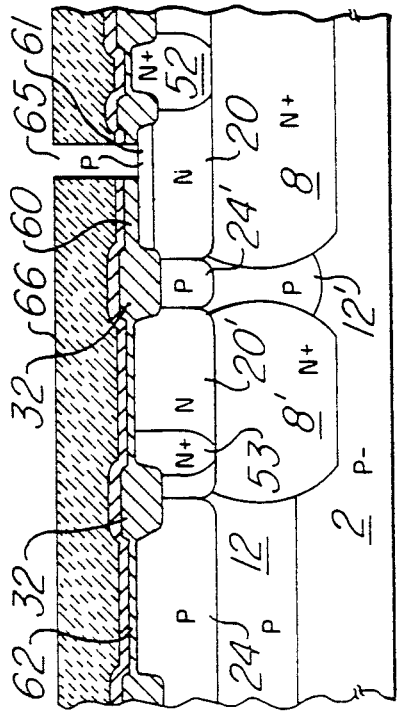
FIG. 3 through 10 are cross-sectional views of a BiCMOS structure formed according to the invention, illustrating various steps in its fabrication.
Figure 5:
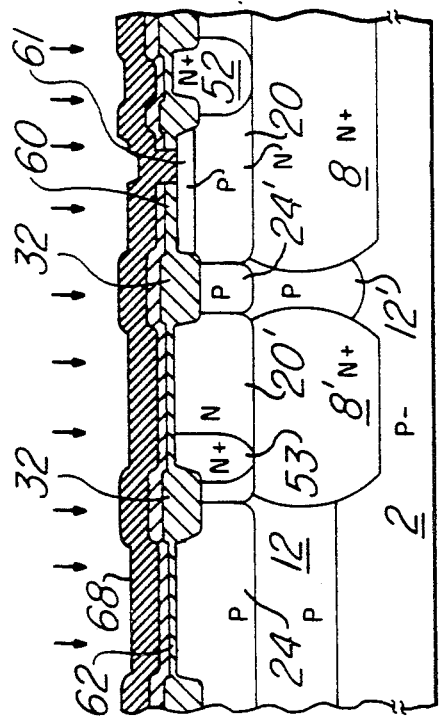

Referring now to FIG. 4, a layer 66 of a masking material such as photoresist is disposed over polysilicon layer 64. Photoresist 66 is patterned and developed according to conventional techniques to define the location of emitter contact 65 at the surface of intrinsic base region 61. Polysilicon layer 64 and oxide layer 60 are then etched at this location according to conventional techniques, with polysilicon layer 64 protected elsewhere by the overlying photoresist layer 66. Photoresist layer 66 is then stripped, and a second polysilicon layer 68 is deposited thereover by conventional deposition methods, as shown in FIG. 5. Due to the etching of the emitter contact 65 through oxide layer 60, polysilicon layer 68 is in physical contact with the surface of intrinsic base 61.

According to the invention, the stacked structure of polysilicon layers 64 and 68 is doped for purposes of increasing its conductivity at all locations of the structure and to provide dopant for the emitter region to be diffused therefrom into intrinsic base region 61. According to the invention, polysilicon layers 64 and 68 are to be doped with two dopant species, one with high diffusivity in silicon and one with low diffusivity in silicon. This doping is preferably done by way of ion implantation, as will be described in greater detail hereinbelow. Other methods of doping the polysilicon layers with the two dopant species may alternatively be used, such methods including in-situ doping of the polysilicon during deposition, and also predeposition of dopant by the decomposition of dopant sources (such as $POCl_3$ or $PH_3$ for phosphorous).

As mentioned hereinabove, ion implantation is the preferred method for providing the dopant species in the stacked layers of polysilicon 64 and 68. In this exemplary embodiment, the preferred dopant species are phosphorous and arsenic, with phosphorous having relatively high diffusivity in silicon relative to that of arsenic. The dose of the phosphorous implant is preferably on the order of 1E15 to 5E15 ions/cm$^2$, implanted at an energy on the order of 80 keV, while the preferred dose and energy of the arsenic implant is on the order of 5E15 to 2E16 ions/cm$^2$ at an energy on the order of 50 keV. As will be apparent from the data described hereinbelow, the implant conditions of the arsenic and phosphorous implants may be adjusted independently from one another, to optimize the emitter depth and conductivity desired for the structure.

Figure 6:
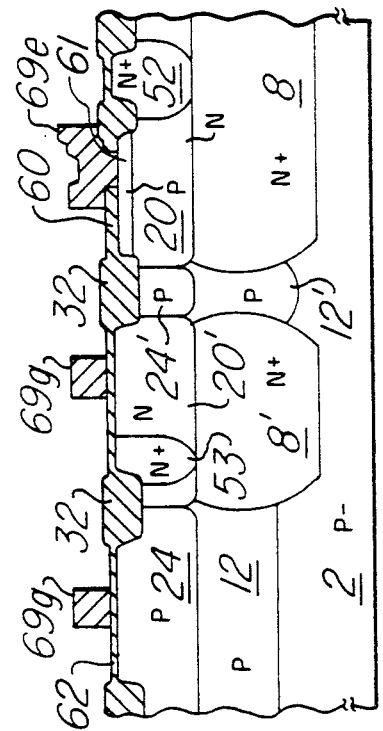
Figure 7:
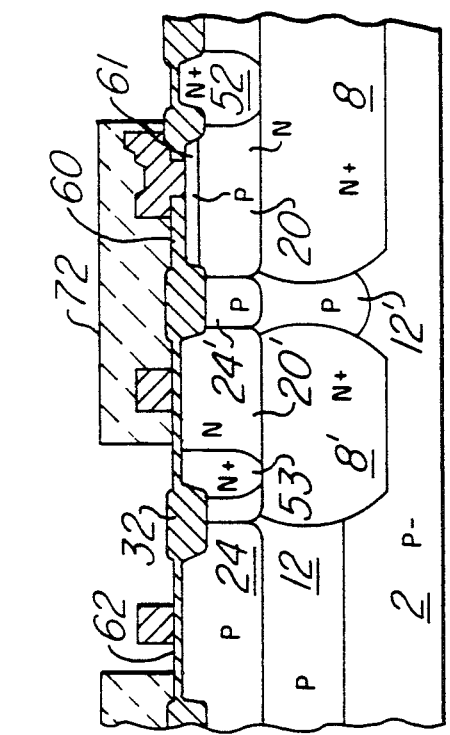

After the doping of layer 64 and 68, the stacked layers are patterned and etched to define gate electrodes 69g and emitter electrode 69e as shown in FIG. 6. The two polysilicon layers 64 and 68 functionally merge into a single layer, and as such will be referred to as single layer structures. A masking layer 72, such as photoresist, is then provided over the surface and is photolithographically patterned and developed to define the locations which are to receive an n-type reachthrough implant, as shown in FIG. 7. The reachthrough implant is used in order to provide a graded junction for the sources and drains of the n-channel MOS transistor, as described in U.S. Pat. No. 4,566,175 assigned to Texas Instruments Incorporated. Masking layer 72 protects the portions of p-well 20' which are to receive the p-type source/drain implant, and protects intrinsic base region 61. While not essential for contact collector contact 52 and n-well contact 53 can receive the reachthrough implant as shown in FIG. 7. The portions of p-well 24 receiving the reachthrough implant are illustrated in FIG. 8 by regions 74.

Figure 8:
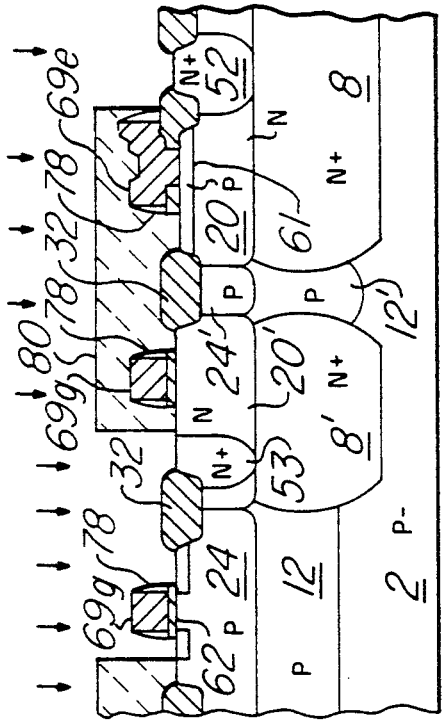

Photoresist layer 72 is then stripped and a layer of silicon dioxide is then deposited overall, for example by way of TEOS decomposition, and is anisotropically etched to form sidewall oxide filaments 78 on the vertical edges of gate electrodes 69g and emitter electrode 69e, as shown in FIG. 8. As described in said U.S. Pat. No. 4,566,175, sidewall oxide filaments 78 are useful in the formation of the graded junction for MOS transistors. A masking layer 80 such as photoresist is then placed over the structure, photolithographically patterned with the same pattern as used for the and developed to mask the portions of p-well 20' and the bipolar region from the n-type source/drain implant; to form the graded junction, the source/drain implant provides a significantly heavier impurity concentration than the reachthrough implant. As described in said application Ser. No. 129,271, the source/drain implant may itself implant both phosphorous and arsenic, to obtain the desired impurity gradient.

Figure 9:
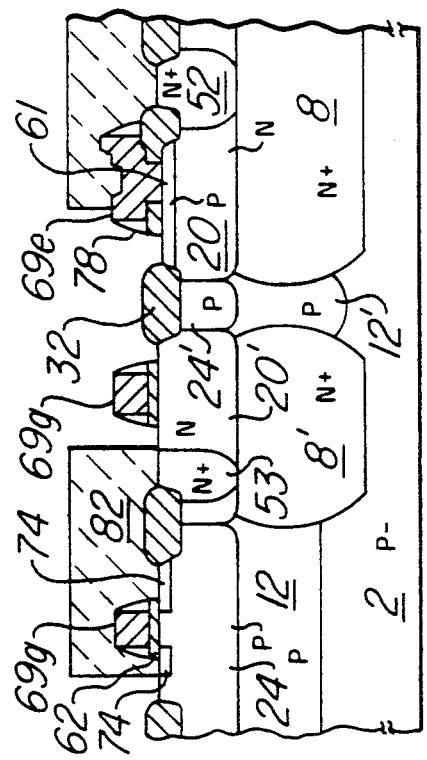

Referring now to FIG. 9, the p-type source/drain implant and extrinsic base implant is illustrated. After stripping photoresist layer 80, masking layer 82 such as photoresist is provided and photolithographically patterned and developed to define the locations which will receive p-type ion implantation. These regions include the source and drain regions of the p-channel transistor in n-well 20', a contact location to p-well 24, and a portion of intrinsic base region 61 at which a high conductivity contact is desired, to reduce series base resistance as is well known in the art. Masking layer 82 protects the regions 74 in p-well 24 which received the n-type reachthrough and source/drain implant, as well as contact regions 52 and 53.

Due to the doping of emitter electrode 69e described above, emitter electrode 69e may be exposed partially or fully to the p-type source/drain implant. This is due to the presence of the arsenic dopant in emitter electrode 69e, which allows the high n-type impurity concentration to be maintained, with minimal counterdoping from the p-type source/drain implant. A typical p-type source/drain implant is on the order of 1E15 to 5E15 ions/cm² of boron, at an energy on the order of 20 keV. It is preferable to overlap masking layer 82 onto emitter electrode 69e, however, to ensure that contact region 52 is fully masked from the p-type source/drain implant. The provision of sidewall oxide filament 78 on the edge of emitter electrode 69e is preferred, as the location of the p-type dopant is thus separated from the emitter region thereby, in a self-aligned manner.

Figure 10:
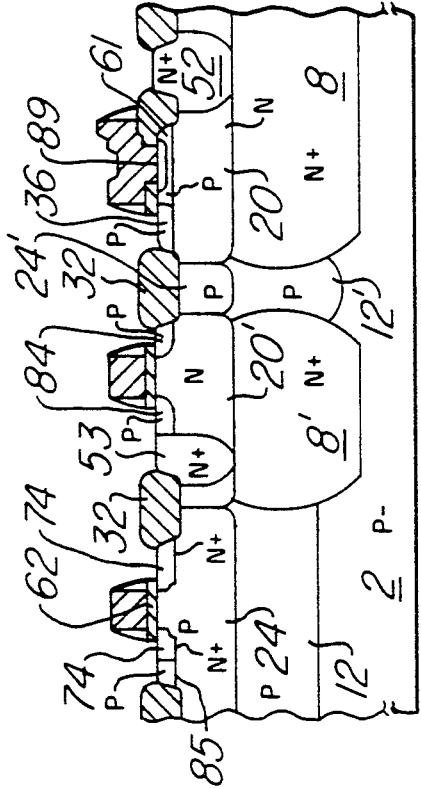

Referring now to FIG. 10, the structure is shown after removal of masking layer 82, and a high temperature anneal used to diffuse the implanted impurities to the desired depth. In this embodiment, this anneal diffuses not only the implanted extrinsic base 86 of the bipolar transistor, and the implanted source/drain regions 74 and 84 of the n-channel and p-channel transistors, respectively, but diffuses dopant from emitter electrode 69e into intrinsic base region 61 to form emitter region 89, as shown in FIG. 10. A typical source/drain anneal is an anneal of 25 minutes at 900 degrees Celsius in an inert atmosphere. Alternatively, the anneal may be done by way of rapid thermal annealing, if desired.

Subsequent to the completion of the method described hereinabove, completion of the transistors and their interconnection can be done in the conventional manner, as described in said copending application Ser. No. 129,271. Individual circuits are then separated from portions of substrate 20, and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments Incorporated.

Figure 11:
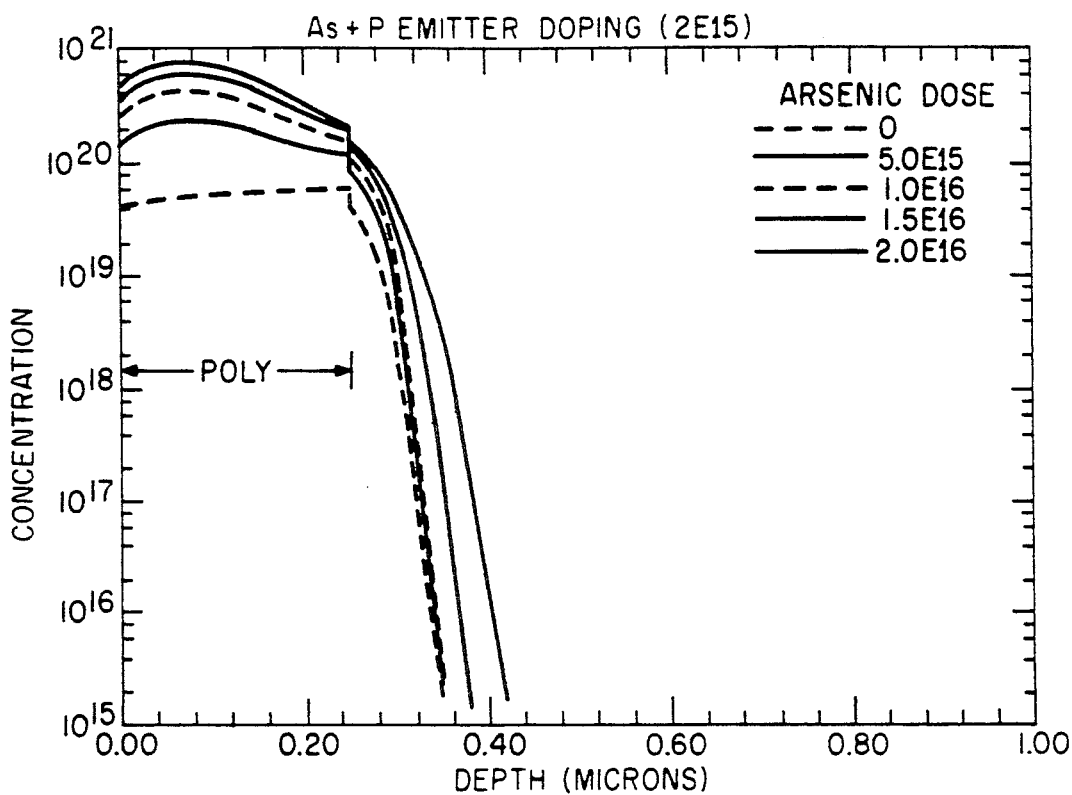
FIG. 11 is a plot of emitter junction depth versus arsenic implant dose for a given phosphorous dose in a transistor according to the invention.
Figure 12:
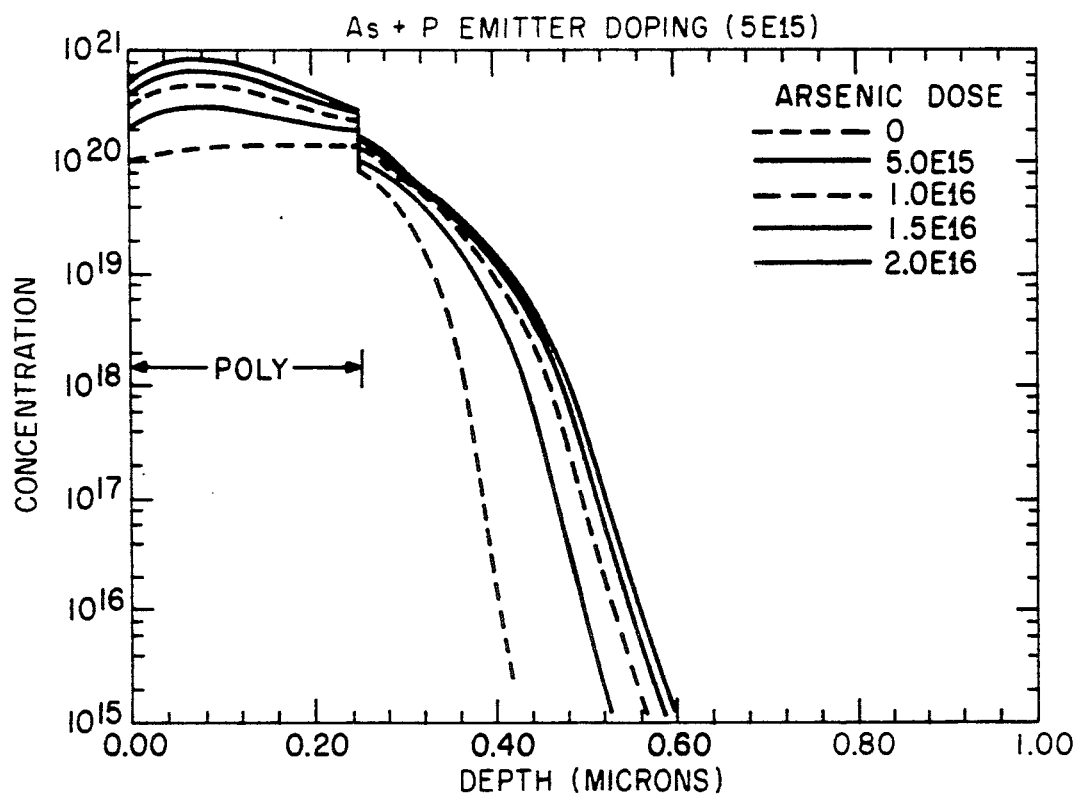
FIG. 12 is plot of emitter junction depth versus arsenic implant dose for a second given phosphorous dose in a transistor according to the invention.

The method according to the invention provides the advantage of a shallow emitter junction with a high impurity concentration in the emitter electrode 69e. In this embodiment, since emitter electrode 69e has both phosphorous and arsenic dopant species therewithin, the phosphorous implant dose may be selected to define the desired emitter junction depth, while the arsenic dose may be selected to define the desired conductivity for emitter electrode 69e. FIG. 11 illustrates, based on SUPREM3 simulation, the dependency of junction depth on the implant dose of arsenic, for the case where the phosphorous implant dose is 2E15 ions/cm². FIG. 11 illustrates that, for arsenic implant doses ranging from none to 2E16 ions/cm², the emitter junction depth after an anneal of 25 minutes at 900 degrees Celsius is on the order of 140 nm from the bottom surface of the polysilicon, with minor variations dependent upon the arsenic dose. FIG. 12 is a similar plot, for the case where the phosphorous implant dose is 5E15 ions/cm². Comparison of FIGS. 11 and 12 shows the strong dependence of emitter junction on the phosphorous implant dose, as the junction depth resulting from the 5E15 ions/cm² dose is approximately 300 nm from the bottom surface of the polysilicon, again with minor variations due to the arsenic dose.

As explained hereinabove, the presence of the arsenic in the emitter electrode serves to reduce the effects of exposure of the emitter electrode to the p-type implant. For transistors fabricated with an emitter electrode which was implanted only with phosphorous, at a dose of 5E15 ions/cm² to provide a relatively shallow junction, a p-type source/drain implant dose of 3E15 ions/cm² was found to cause an increase in $BV_{CEO}$ of 2 volts due to the counterdoping from the p-type implant. For a transistor which received the 5E15 ions/cm² phosphorous implant along with a 1E16 ions/cm² implant of arsenic, no effect on BVCEO was noted due to exposure to the above p-type source/drain implant.

Accordingly, the provision of the two dopant species used in doping the emitter electrode allows for relatively independent control of the emitter junction depth and the impurity concentration of the polysilicon emitter electrode, due to the difference in diffusivity of the two species. This provides an emitter junction which is primarily doped with ions of the species with the greater diffusivity, with the species of the lesser diffusivity remaining in the emitter electrode. For the example described hereinabove, the emitter junction is primarily phosphorous doped, with the implanted arsenic remaining behind in the emitter electrode. The presence of the arsenic, for example, in the emitter electrode further provides a high impurity concentration at the interface between the polysilicon and the underlying single crystal silicon, which improves the emitter efficiency of the transistor. The above described example used phosphorous and arsenic as the dopants, but of course other dopants may be substituted therefor if desired, while still obtaining the benefits of the invention. For example, antimony is another example of an n-type dopant species with a relatively low diffusivity.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A bipolar transistor formed at a surface of a semiconductor body, comprising:
   a collector region of a first conductivity type;
   a base region of a second conductivity type disposed within said collector region at said surface;
   an emitter electrode comprising a semiconductor material slightly doped with a remaining portion of a first dopant species and heavily doped with a second dopant species, both of said first conductivity type, said first dopant species having a relatively greater diffusivity than said second dopant species; and
   an emitter region of said first conductivity type disposed within said base region and in contact with said emitter electrode, said emitter region heavily doped with said first dopant and slightly doped with said second dopant by said first and second dopants diffused from said emitter electrode.

2. The bipolar transistor of claim 1, further comprising:
   a dielectric layer disposed over said base region, wherein said emitter electrode overlies said dielectric layer and is in contact with said base region through a contact etched through said dielectric layer.

3. The bipolar transistor of claim 2, wherein the shape of said emitter region is characteristic of diffusion of dopant from said emitter electrode through said contact.

4. The bipolar transistor of claim 1, further comprising:
   an extrinsic base region of said second conductivity type formed within said base region at said surface, said extrinsic base region being relatively more heavily doped than said base region.

5. The bipolar transistor of claim 1, wherein said first conductivity type is n-type and said second conductivity type is p-type.

6. The bipolar transistor of claim 5, wherein said first dopant is phosphorous.

7. The bipolar transistor of claim 6, wherein said second dopant is arsenic.

8. The device of claim 1 wherein said emitter electrode is formed of two layers of semiconductor material.

9. A bipolar transistor formed at a surface of a semiconductor body, comprising:
   a collector having a first conductivity formed in said body;
   a region disposed within said collector at said surface, said region including a dopant of a second conductivity type and defining a base portion having a second conductivity and an emitter portion disposed within said base portion; and
   a semiconductor emitter electrode in contact with said region at said surface, said semiconductor emitter electrode slightly doped with a remaining portion of a first dopant and heavily doped with a second dopant, both of said first conductivity type, said first dopant having a relatively high diffusivity relative to said second dopant, said emitter portion heavily doped with said first dopant and slightly doped with said second dopant, both said first and second dopants in said emitter portion diffused from said emitter electrode such that said emitter portion is of said first conductivity.

10. The bipolar transistor of claim 9, further comprising:
    a dielectric layer formed over said region prior to said step of forming a semiconductor emitter electrode, said dielectric layer defining a via therethrough such that said semiconductor emitter electrode contacts said base region.

11. The bipolar transistor of claim 9, wherein said first dopant is phosphorous.

12. The bipolar transistor of claim 11, wherein said second dopant is arsenic.

13. The bipolar transistor of claim 9, wherein said semiconductor layer is polycrystalline silicon.

14. The bipolar transistor of claim 9, wherein said first and second dopants are ion implanted into said semiconductor emitter electrode.

15. The device of claim 9 wherein said emitter electrode is formed of two layers of semiconductor material.

16. A bipolar and field effect transistor formed at a surface of a semiconductor body, comprising:
    a collector having a first conductivity formed in said body;
    a region disposed within said collector at a first location of said surface, said region including a dopant of a second conductivity type and defining a base portion having a second conductivity and an emitter portion disposed within said base portion;
    a first well of said first conductivity type defined in said body at a second location of said surface;
    a semiconductor emitter electrode in contact with said region, said emitter electrode slightly doped with a remaining portion of a first dopant and heavily doped with a second dopant, both of said first conductivity type, said first dopant having a relatively high diffusivity relative to said second dopant, said emitter portion heavily doped with said first dopant and slightly doped with said second dopant, both said first and second dopants in said emitter portion diffused from said emitter electrode such that said emitter portion is of said first conductivity;
    a first semiconductor gate electrode overlying said first well, said first gate electrode doped with at least one of said first and second dopants, portions of said first well near said gate electrode including dopants of said second conductivity type.

17. The transistors of claim 16, wherein said first conductivity type is n type, and said second conductivity type is p type.

18. The transistors of claim 16, wherein said first dopant is phosphorous.

19. The transistors of claim 18, wherein said second dopant is arsenic.

20. The transistors of claim 16, wherein said semiconductor emitter electrode is polycrystalline silicon.

21. The device of claim 16 wherein said emitter electrode and said gate electrode are formed of two layers of semiconductor material.

22. The device of claim 16 and further comprising:
    a second well of said second conductivity type defined in said body at a third location of said surface; and
    a second semiconductor gate electrode overlying said second well, said second gate electrode doped with at least one of said first and second dopants.

* * * * *